United States Patent
Miyachi

(10) Patent No.: US 8,222,729 B2
(45) Date of Patent: Jul. 17, 2012

(54) ELECTRIC POWER CONVERTER

(75) Inventor: Syuhei Miyachi, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 13/068,767

(22) Filed: May 19, 2011

(65) Prior Publication Data

US 2011/0285010 A1    Nov. 24, 2011

(30) Foreign Application Priority Data

May 20, 2010    (JP) ................. 2010-116317

(51) Int. Cl.
*H01L 23/10* (2006.01)

(52) U.S. Cl. .. 257/706; 257/707; 257/675; 257/E23.101

(58) Field of Classification Search ............... 257/275, 257/625, 675, 706, 707, 712–722, 796, E33.075, 257/E31.131, E23.051, E23.08–E23.113; 438/122, FOR. 413

See application file for complete search history.

(56) References Cited

U.S. PATENT DOCUMENTS

| | | | | |
|---|---|---|---|---|
| 4,172,261 A | * | 10/1979 | Tsuzuki et al. | 257/717 |
| 5,644,163 A | * | 7/1997 | Tsuji | 257/706 |
| 5,844,313 A | * | 12/1998 | Hoffmann | 257/722 |
| 7,038,311 B2 | * | 5/2006 | Woodall et al. | 257/706 |
| 7,678,592 B2 | * | 3/2010 | Lee et al. | 438/26 |

FOREIGN PATENT DOCUMENTS

| | | |
|---|---|---|
| JP | 2002-373970 | 12/2002 |
| JP | 2003-046035 | 2/2003 |
| JP | 2004-006791 | 1/2004 |
| JP | 2004-259977 | 9/2004 |
| JP | 2005-045960 | 2/2005 |
| JP | 2005-057108 | 3/2005 |
| JP | 2007-235060 | 9/2007 |
| JP | 2008-226890 | 9/2008 |

OTHER PUBLICATIONS

Office Action dated Mar. 23, 2012 issued in corresponding Japanese Application No. 2010-116317 with English translation.

* cited by examiner

*Primary Examiner* — Jasmine Clark
(74) *Attorney, Agent, or Firm* — Harness, Dickey & Pierce, PLC

(57) ABSTRACT

An electric power converter includes: a heat sink having a heat receiving surface; a semiconductor module including a metal plate having a heat radiation surface, a switching element on the metal plate opposite to the heat radiation surface, and a resin member covering a part of the metal plate and the switching element; a heat radiation member between the heat receiving surface and the semiconductor module for transmitting heat of the switching element to the heat receiving surface via the metal plate. The heat receiving surface includes a concavity, and the heat radiation surface includes a convexity. The heat radiation member has a predetermined area sandwiched between the concavity and the convexity.

10 Claims, 12 Drawing Sheets

ELECTRIC POWER CONVERTER

CROSS REFERENCE TO RELATED APPLICATION

This application is based on Japanese Patent Application No. 2010-116317 filed on May 20, 2010, the disclosure of which is incorporated herein by reference.

TECHNICAL FIELD

The present invention relates to an electric power converter for converting electric power with using a switching element.

BACKGROUND

Conventionally, heat generated by a switching element in a semiconductor module is radiated through a heat sink in an electric power converter. In JP-A-20023-373970, a heat radiation sheet as a heat radiation member is formed between the semiconductor module and the heat sink (FIG. 3). A part of the heat radiation sheet is sandwiched between a metal electrode plate and the heat sink in the semiconductor module. An IGBT as the switching element is formed on the metal electrode plate. Accordingly, when the IGBT functions to turn on and off so that the IGBT generates heat repeatedly, the metal electrode plate expands and shrinks repeatedly.

When accuracy of a surface processing of the metal electrode plate and the heat sink is low, the surface of the metal electrode plate and the surface of the heat sink, which contact the heat radiation sheet, may include multiple small protrusions having a side surface slanting on one side of the expanding and shrinking direction. In this case, when the metal electrode plate repeatedly expands and shrinks, the heat radiation sheet sandwiched between the metal electrode plate and the heat sink moves to a direction opposite to the side surface of the protrusion. This effect is defined as "ratcheting phenomenon." When the ratcheting phenomenon continuously occurs, the heat radiation sheet may protrude or removed from an interface between the semiconductor module and the heat sink.

SUMMARY

In view of the above-described problem, it is an object of the present disclosure to provide an electric power converter for converting electric power with using a switching element. In the converter, a heat radiation member is restricted from penetrating or removing from the converter.

According to a first aspect of the present disclosure, an electric power converter includes: a heat sink having a heat receiving surface; a semiconductor module including a metal plate, a switching element and a resin member, wherein the metal plate has a heat radiation surface facing the heat receiving surface, the switching element is disposed on a surface of the metal plate opposite to the heat radiation surface and generates heat when the switching element functions, and the resin member covers at least a part of the switching element and a part of the metal plate; and a heat radiation member having a sheet shape and disposed between the heat receiving surface of the heat sink and the semiconductor module for transmitting the heat of the switching element to the heat receiving surface via the metal plate. One of the heat receiving surface and the heat radiation surface includes a concavity, which is concaved to a side opposite to the other one of the heat receiving surface and the heat radiation surface. The other one of the heat receiving surface and the heat radiation surface includes a convexity at a position corresponding to the concavity. The convexity has a shape corresponding to the concavity, and protrudes to the side opposite to the other one of the heat receiving surface and the heat radiation surface. The heat radiation member has a predetermined area corresponding to the concavity and the convexity. The predetermined area of the heat radiation member is sandwiched between the concavity and the convexity.

In the above converter, an outer periphery portion of the predetermined area of the heat radiation member is sandwiched between an inner wall of the concavity perpendicular to the heat receiving surface of the heat sink and an outer wall of the convexity perpendicular to the heat receiving surface. Thus, even when the metal plate expands and shrinks according to the heat in the switching element, the displacement of the heat radiation member in a planar direction caused by a ratcheting phenomenon is restricted. Accordingly, the heat radiation member is restricted from protruding and being removed from a space between the heat sink and the semiconductor module.

According to a second aspect of the present disclosure, an electric power converter includes: a heat sink having a heat receiving surface; a semiconductor module including a metal plate, a switching element and a resin member, wherein the metal plate has a heat radiation surface facing the heat receiving surface, the switching element is disposed on a surface of the metal plate opposite to the heat radiation surface and generates heat when the switching element functions, and the resin member covers at least a part of the switching element and a part of the metal plate and includes a facing surface facing the heat receiving surface; and a heat radiation member having a sheet shape and disposed between the heat receiving surface of the heat sink and the semiconductor module for transmitting the heat of the switching element to the heat receiving surface via the metal plate. One of the heat receiving surface and the facing surface includes a concavity, which is concaved to a side opposite to the other one of the heat receiving surface and the facing surface. The other one of the heat receiving surface and the facing surface includes a convexity at a position corresponding to the concavity. The convexity has a shape corresponding to the concavity, and protrudes to the side opposite to the other one of the heat receiving surface and the facing surface. The heat radiation member has a part corresponding to the concavity and the convexity. The part of the heat radiation member is sandwiched between the concavity and the convexity.

In the above converter, an outer periphery portion of the part of the heat radiation member is sandwiched between an inner wall of the concavity perpendicular to the heat receiving surface of the heat sink and an outer wall of the convexity perpendicular to the heat receiving surface. Thus, even when the metal plate expands and shrinks according to the heat in the switching element, the displacement of the heat radiation member in a planar direction caused by a ratcheting phenomenon is restricted. Accordingly, the heat radiation member is restricted from protruding and being removed from a space between the heat sink and the semiconductor module.

According to a third aspect of the present disclosure, an electric power converter includes: a heat sink having a heat receiving surface; a semiconductor module including a metal plate, a switching element and a resin member, wherein the metal plate has a heat radiation surface facing the heat receiving surface, the switching element is disposed on a surface of the metal plate opposite to the heat radiation surface and generates heat when the switching element functions, and the resin member covers at least a part of the switching element and a part of the metal plate and includes a facing surface facing the heat receiving surface; and a heat radiation member having a sheet shape and disposed between the heat receiving surface of the heat sink and the semiconductor module for transmitting the heat of the switching element to the heat receiving surface via the metal plate. One of the heat receiving surface and the facing surface includes a plurality of concavities, which are concaved to a side opposite to the other one of the heat receiving surface and the facing surface. The other one of the heat receiving surface and the facing surface includes a plurality of convexities at positions corresponding to the concavities. Each convexity has a shape corresponding to the concavity, and protrudes to the side opposite to the other one of the heat receiving surface and the facing surface. The heat radiation member has a plurality of holes at positions corresponding to the convexities. The heat radiation member is sandwiched between the concavity and the convexity in such a manner that each convexity penetrates a corresponding hole, and is inserted into a corresponding concavity.

In the above converter, the heat radiation member is restricted from moving in the planar direction since multiple convexities are inserted through the holes of the heat radiation member. Thus, even when the metal plate expands and shrinks according to the heat in the switching element, the displacement of the heat radiation member in a planar direction caused by the ratcheting phenomenon is restricted. Accordingly, the heat radiation member is restricted from protruding and being removed from a space between the heat sink and the semiconductor module.

According to a fourth aspect of the present disclosure, an electric power converter includes: a heat sink having a heat receiving surface; a semiconductor module including a metal plate, a switching element and a resin member, wherein the metal plate has a heat radiation surface facing the heat receiving surface, the switching element is disposed on a surface of the metal plate opposite to the heat radiation surface and generates heat when the switching element functions, and the resin member covers at least a part of the switching element and a part of the metal plate and includes a facing surface facing the heat receiving surface; and a heat radiation member having a sheet shape and disposed between the heat receiving surface of the heat sink and the semiconductor module for transmitting the heat of the switching element to the heat receiving surface via the metal plate. The heat radiation surface includes a metal convexity, which protrudes to a heat receiving surface side from the facing surface. The facing surface includes a plurality of resin convexities, which protrude to the heat receiving surface side. Each resin convexity has a protrusion height from the facing surface, and the protrusion height of the resin convexity is substantially equal to a protrusion height of the metal convexity from the facing surface. The metal convexity is disposed between adjacent resin convexities. The heat radiation member has a part corresponding to the resin convexity and the metal convexity. The part of the heat radiation member is sandwiched between the metal convexity and the heat receiving surface.

In the above converter, the part of the heat radiation member is sandwiched between the metal convexity or the resin convexity and the heat receiving surface of the heat sink. In general, the linear thermal expansion coefficient of resin is smaller than that of metal. Since the heat radiation member is sandwiched between multiple resin convexities and the heat receiving surface of the heat sink, the heat radiation member is stably pressed on the heat receiving surface side with multiple resin convexities. Thus, even when the metal plate expands and shrinks repeatedly according to the heat of the switching element, the displacement of the heat radiation member in the planar direction caused by the ratcheting phenomenon is restricted. Accordingly, the heat radiation member is restricted from protruding or being removed from an interface between the semiconductor module and the heat sink.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

First Embodiment

An electric power converter 1 according to a first embodiment is shown in FIGS. 1 to 3B. FIGS. 1A and 1B cross sectional views of the converter 1. To simplify the drawings of FIGS. 1A and 1B, a hatching is not shown in FIGS. 1A and 1B.

The electric power converter 1 is arranged between, for example, an alternating current electric motor and a direct current power source. The converter 1 converts the direct current from the DC power source to the alternating current, and then, supplies the alternating current to the motor. The converter 1 includes a heat sink 2, a semiconductor module 3, a heat radiation plate 4 and the like.

Figure 2:
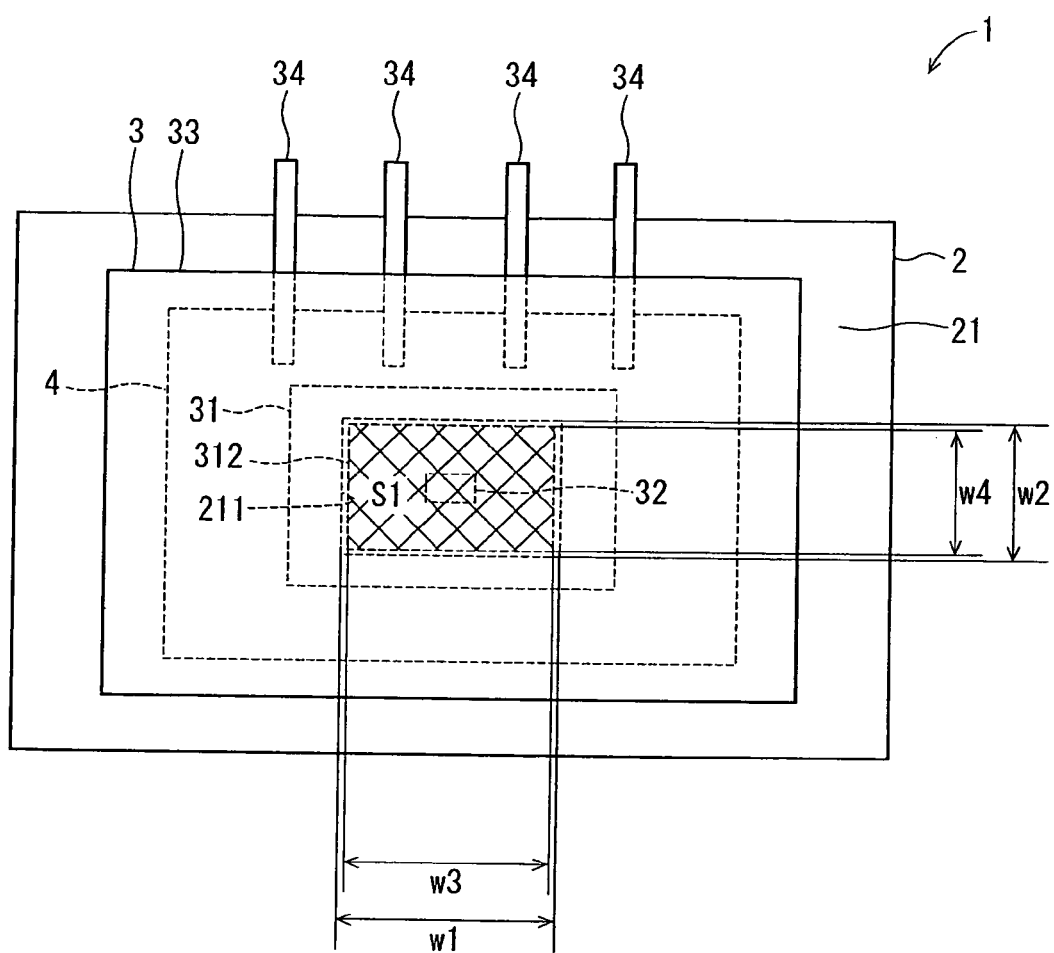
FIG. 2 is a view showing the converter viewing from an arrow II in FIG. 1A.
Figure 3A:
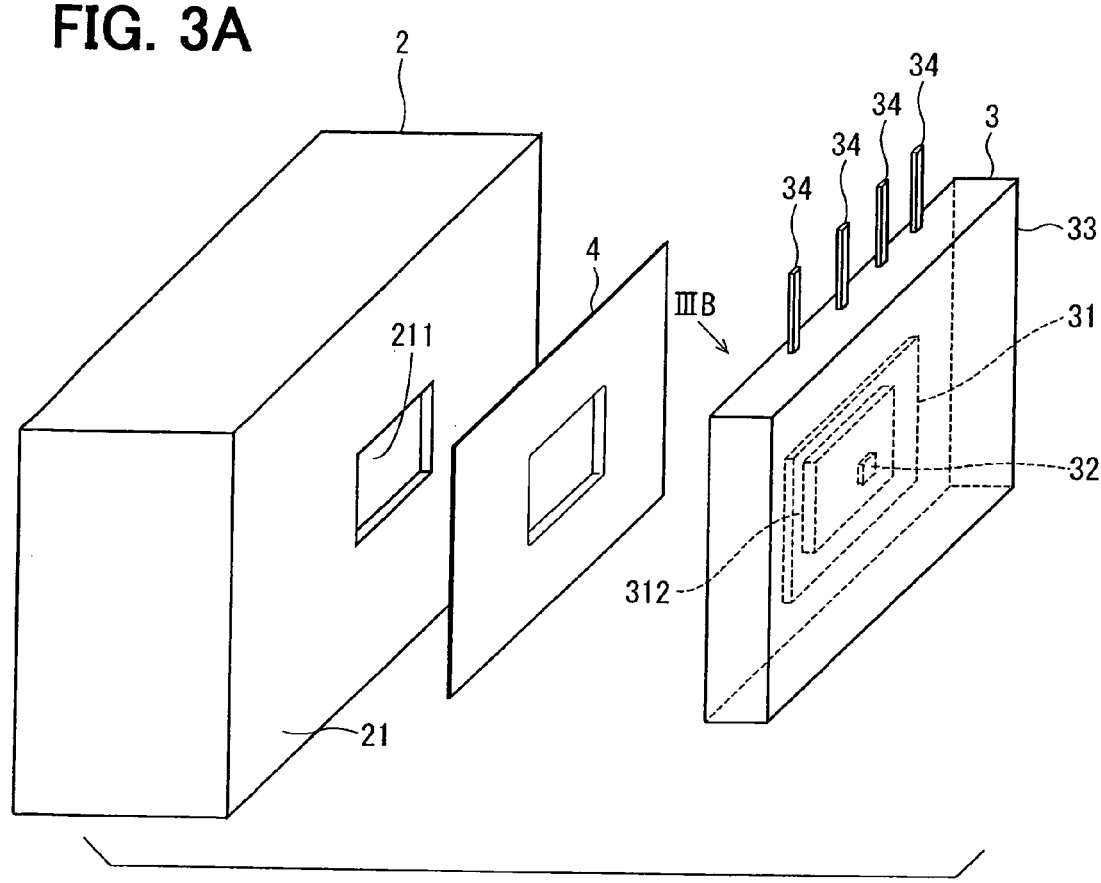
FIG. 3A is an exploded perspective view showing the electric power converter.
Figure 3B:
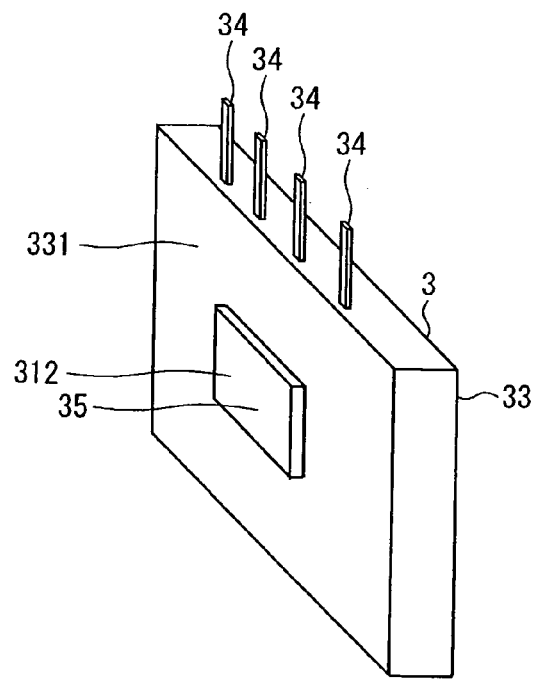
FIG. 3B is a view showing the converter viewing from an arrow IIIB in FIG. 3A.

The heat sink 2 is made of metal such as aluminum. The heat sink 2 includes a heat receiving surface 21. The heat sink 2 has a concavity 211, which is concaved from the heat receiving surface 21. In the present embodiment, as shown in FIGS. 2 and 3A, the concavity 211 has an outline of a rectangular shape viewing from a direction perpendicular to the heat receiving surface 21.

The semiconductor module 3 includes a metal plate 31, a switching element 32 and a resin member 33.

The metal plate 31 is made of metal having high heat conductivity such as copper. A heat radiation surface 311 is formed on the metal plate 31. The heat radiation surface 311 faces the heat receiving surface 21 of the heat sink 2. The switching element 32 has a plate shape, and the switching element is disposed on a surface of the metal plate 31 opposite to the heat radiation surface 311. The resin member 33 covers a part of the switching element 32 and a part of the metal plate 31.

In the present embodiment, the switching element 32 other than the surface of the element 32, which contacts the metal plate 31, is covered with the resin member 33. The metal plate 31 is partially covered with the resin member 33. Here, the resin member 33 has a facing surface 331, which faces the heat receiving surface 21 of the heat sink 2.

Here, the switching element 32 is a semiconductor device such as a MOSFET and an IGBT. As shown in FIG. 2, multiple terminals 34 are embedded in the resin member 33. Each terminal 34 is coupled with the switching element 32 or the metal plate 31. A control signal for controlling the switching function of the switching element 32 flows in the terminal 34. When the switching element 32 performs the switching operation, a comparatively large current flows in the switching element via a bus bar. Accordingly, the switching element 32 generates heat when the switching element 32 functions. The heat from the witching element 32 is radiated from the heat radiation surface 311 of the metal plate 31.

As shown in FIGS. 1A to 3B, a convexity 312 is formed at a position of the heat radiation surface 311 of the metal plate 31 corresponding to the concavity 211 of the heat sink 2. The convexity 312 protrudes toward the heat receiving surface side, and the convexity 312 has a shape corresponding to the shape of the concavity 211. Specifically, the convexity 312 has an outline of a rectangular shape viewing from a direction perpendicular to the heat radiation surface 311. In the present embodiment, the resin member 33 covers the metal plate 31 other than the convexity 312. Specifically, a part of the convexity 312 on the metal plate 31 is exposed from the resin member 33, and protrudes from the facing surface 331 toward the heat sink side.

The heat radiation member 4 has a sheet-like shape having a rectangular shape. The heat radiation member 4 is sandwiched between the heat receiving surface 21 of the heat sink 2 and the semiconductor module 3. The heat radiation member 4 is formed such that a silicone rubber including a filler such as boron nitride or alumina is applied to both sides of a glass fiber cloth having a predetermined thickness. Thus, the heat radiation member 4 has comparatively high electric insulation property and heat conductivity. Further, since the heat radiation member 4 includes silicone rubber, the member 4 is elastically deformable.

In the present embodiment, the semiconductor module 3 is fixed to the heat sink 2 with a connecting member such as a screw (not shown) under a condition that the heat radiation member 4 is sandwiched between the semiconductor module 3 and the heat sink 2. In the present embodiment, as shown in FIGS. 1A to 3, a predetermined area S1 of the heat radiation member 4 corresponding to the concavity 211 of the heat sink 2 and the convexity 312 of the metal plate 31 is sandwiched between the concavity 211 and the convexity 312. The predetermined area S1 is a portion hatched with a grid in FIG. 2. Thus, the heat radiation member 4 is deformable to be a saucer shape, as shown in FIG. 3A. Further, the member 4 is tightly attached to a wall surface of the concavity 211 and a wall surface of the convexity 312.

Figure 1A:
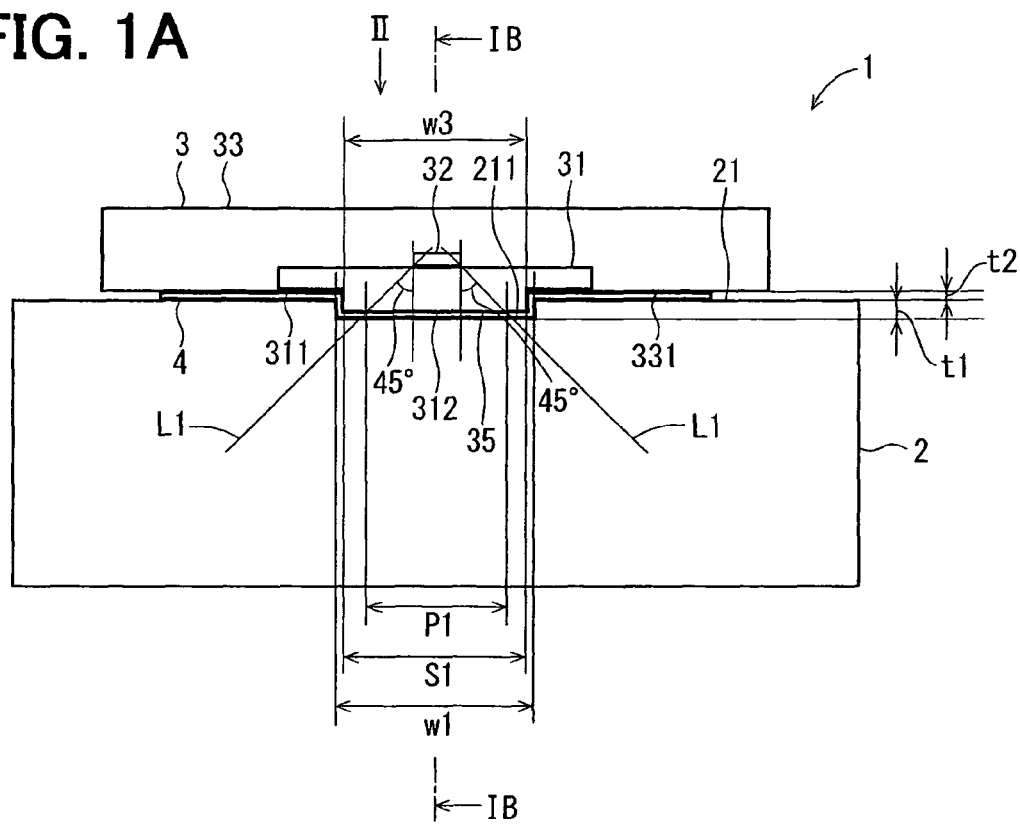
FIG. 1A is a cross sectional view showing an electric power converter taken along line IA-IA in FIG. 1B according to a first embodiment.

As shown in FIG. 1A, a depth of the concavity 211 is defined as t1, and the thickness of the heat radiation member 4 is defined as t2. The concavity 211 and the heat radiation member 4 has a relationship of t1>t2. Here, it is preferred that t2 satisfies with a relationship of $0 \text{ mm} < t2 <= 0.5 \text{ mm}$.

Figure 1B:
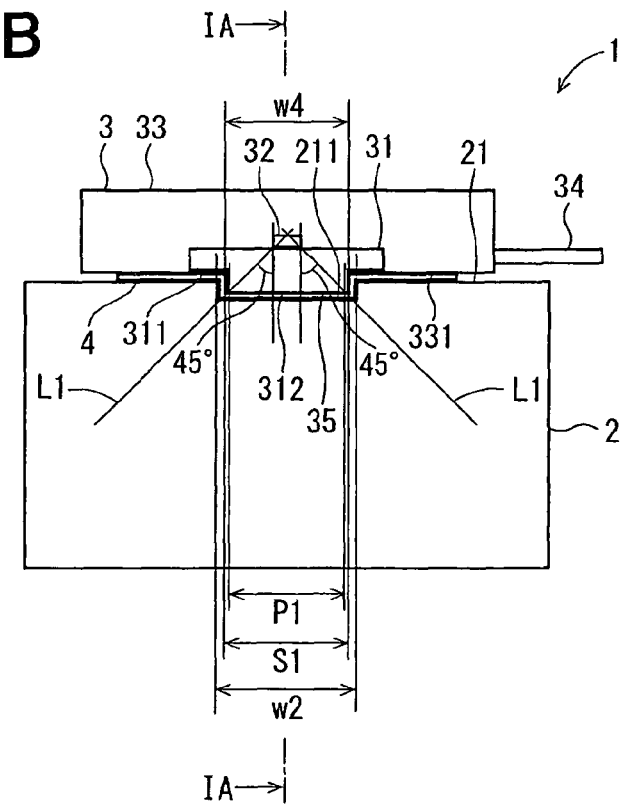
FIG. 1B is a cross sectional view showing the converter taken along line IB-IB in FIG. 1A.

In the present embodiment, as shown in FIGS. 1A and 1B, the width of the concavity 211 in the longitudinal direction is defined as w1, and the width of the concavity 211 in the lateral direction is defined as w2. The width of the convexity 312 in the longitudinal direction is defined as w3, and the width of the convexity 312 in the lateral direction is defined as w4. The concavity 211, the convexity 312 and the heat radiation member 4 have the relationship of: $0 < w1-w3 <= 2 \times t2$ and $0 < w2-w4 <= 2 \times t2$. Thus, the predetermine area S1 of the heat radiation member 4 has an outer periphery portion, which is sandwiched between the inner wall of the concavity 211 perpendicular to the heat receiving surface 21 of the heat sink 2 and the outer wall of the convexity 312 perpendicular to the heat receiving surface 21 of the heat sink 21, or is elastically deformed (i.e., slightly squeezed so that the portion shrinks).

Further, as shown in FIGS. 1A and 1B, the predetermined area S1 of the heat radiation member 4 includes a portion P1, which is cut from the heat radiation member 4 by a virtual straight line L1 contacting the outer periphery portion of the switching element 32 and slanting by 45 degrees with respect to the thickness direction of the switching element 32. Here, a large part of the heat generated by the switching element 32 is conducted to the heat sink 2 via the portion P1.

As described above, in the present embodiment, the heat receiving surface 21 of the heat sink 2 (or, one of the heat receiving surface 21 of the heat sink 2 and the heat radiation surface 311 of the metal plate 31) has the concavity 211, which is concaved toward a direction opposite to the heat radiation surface 311 of the metal plate 31. The heat radiation surface 311 of the metal plate 31 (or, the other one of the heat receiving surface 21 and the heat radiation surface 311) includes the convexity 312, which is disposed at a position corresponding to the concavity 211, has the shape corresponding to the shape of the concavity 211, and protrudes toward the heat receiving surface 21. In the heat radiation member 4, the predetermined area S1 corresponding to the concavity 211 and the convexity 312 is sandwiched between the concavity 211 and the convexity 312. Specifically, the outer periphery portion of the predetermine area S1 of the heat radiation member 4 is sandwiched between the inner wall of the concavity 211 perpendicular to the heat receiving surface 21 of the heat sink 2 and the outer wall of the convexity 312 perpendicular to the heat receiving surface 21 of the heat sink 2. Thus, even when the metal plate 31 expands and shrinks repeatedly according to the heat generation of the switching element 32, the movement of the heat radiation member 4 on a surface direction caused by the ratcheting phenomenon is restricted. Accordingly, the heat radiation member 4 is restricted from protruding or being removed from an interface between the semiconductor module 3 and the heat sink 2. In the present embodiment, when the depth of the concavity 211 is defined as t1, and the thickness of the heat radiation member 4 is defined as t2, the concavity 211 and the heat radiation member 4 has the relationship of t1> t2. Specifically, the outer periphery portion of the predetermined area S1 of the heat radiation member 4 is sandwiched between the inner wall of the concavity 211 perpendicular to the heat receiving surface 21 of the heat sink 2 and having the height of t1 larger than the thickness of t2 of the heat radiation member 4 and the outer wall of the convexity 312 perpendicular to the heat receiving surface 21 of the heat sink 2. Accordingly, the heat radiation member 4 is restricted from moving on the surface direction. The movement of the member 4 is caused by the ratcheting phenomenon.

In the present embodiment, the concavity 211 and the convexity 312 are formed to have an outline of a rectangular shape viewing in a direction perpendicular to the heat receiving surface 21 of the heat sink 2. The width of the concavity 211 in the longitudinal direction is defined as w1, and the width of the concavity 211 in the latitudinal direction is defined as w2. The width of the convexity 312 in the longitudinal direction is defined as w3, and the width of the convexity 312 in the latitudinal direction is defined as w4. The concavity 211, the convexity 312 and the heat radiation member 4 have the relationship of:

$$w1 > w3,$$

$$w2 > w4,$$

$$w1 - w3 < 2 \times t2, \text{ and}$$

$$w2 - w4 < 2 \times t2.$$

Thus, the outer periphery portion of the predetermined area S1 of the heat radiation member 4 is sandwiched between the inner wall of the concavity 211 perpendicular to the heat receiving surface 21 of the heat sink 2 and the outer wall of the convexity 312 perpendicular to the heat receiving surface 21 of the heat sink 2, so that the outer periphery portion is slightly pressed and shrinks (i.e., elastically deformed). Thus, the displacement of the heat radiation member 4 in the planar direction caused by the ratcheting phenomenon is restricted effectively.

In the present embodiment, the predetermined area S1 of the heat radiation member 4 includes a portion P1, which is prepared such that a part of the heat radiation member 4 is defined to be partitioned by the virtual straight line L1 contacting the outer periphery portion of the switching element 32 and having a slanting angle of 45 degrees with respect to the thickness direction of the switching element 32. In the present embodiment, the heat radiation member 4 is sandwiched between the concavity 211 and the convexity 312, so that at least the predetermined area S1 is restricted from displacing in the planar direction caused by the ratcheting phenomenon. Accordingly, the heat of the switching element 32 is transmitted to the heat sink effectively and stably through the portion P1 of the heat radiation member 4.

Second Embodiment

Figure 4A:
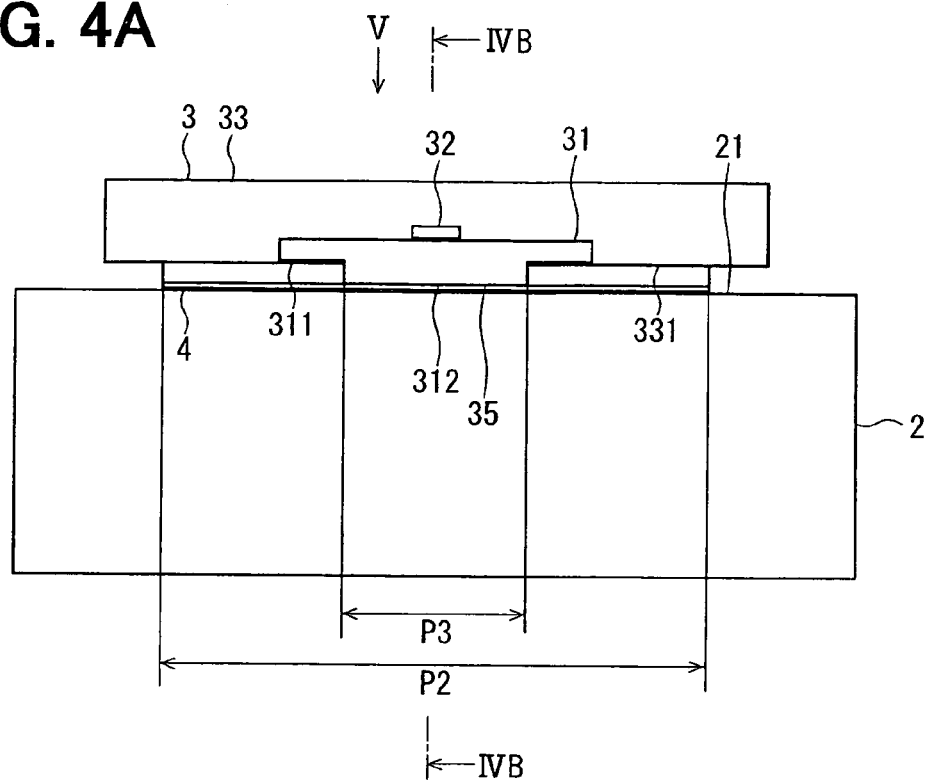
FIG. 4A is a cross sectional view showing an electric power converter taken along line IVA-IVA in FIG. 4B according to a second embodiment.
Figure 4B:
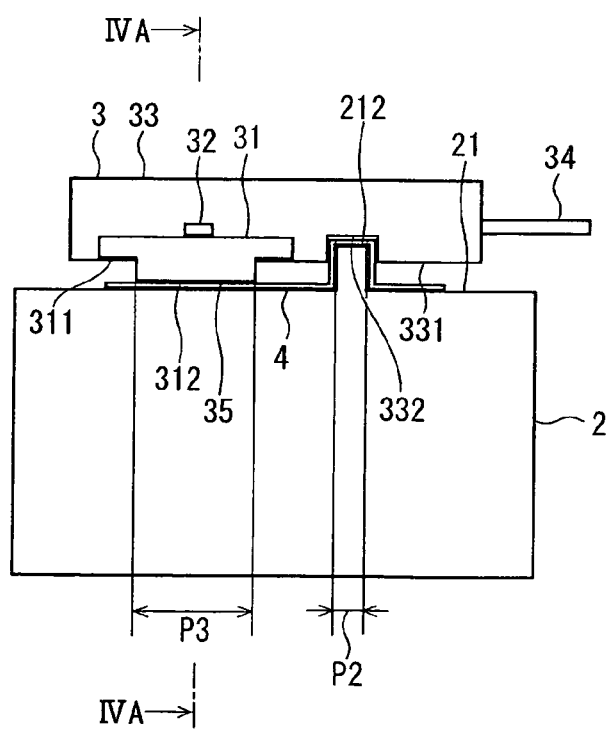
FIG. 4B is a cross sectional view showing the converter taken along line IVB-IVB in FIG. 4A.
Figure 6A:
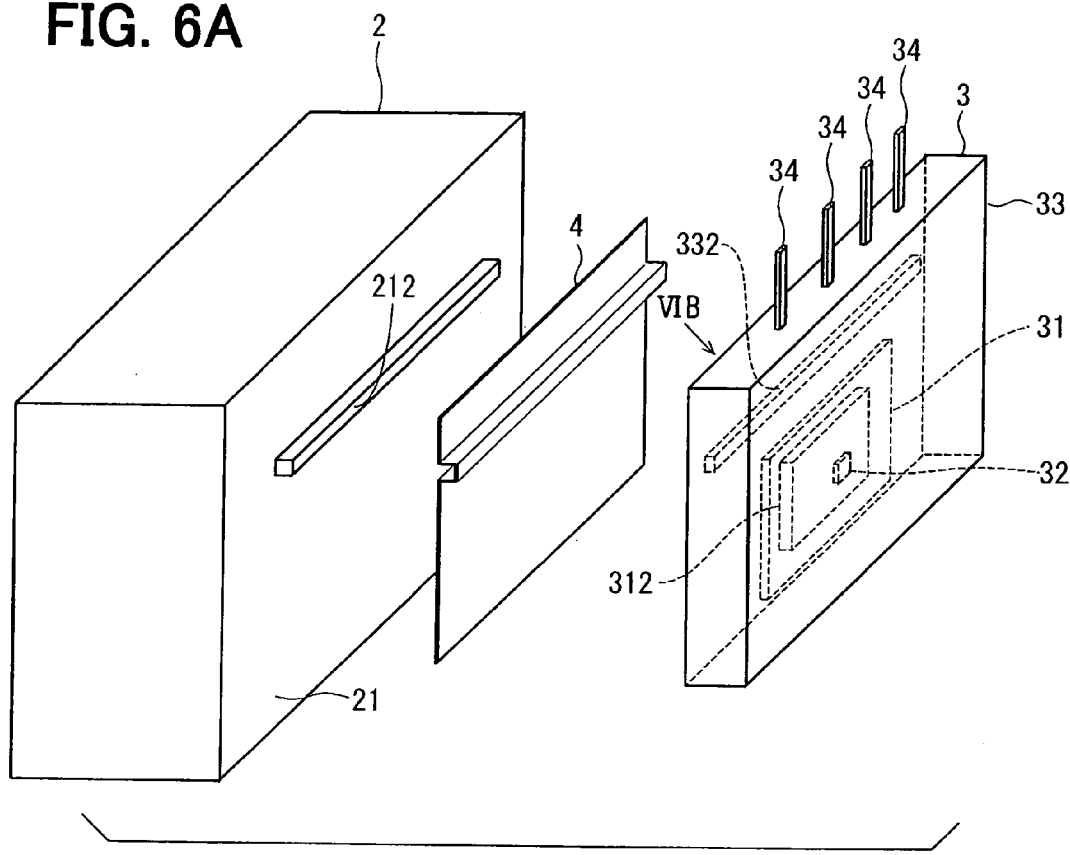
FIG. 6A is an exploded perspective view showing the electric power converter.
Figure 6B:
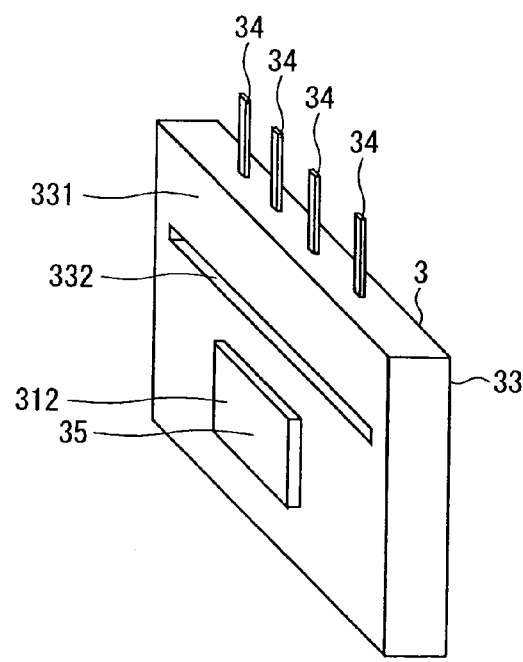
FIG. 6B is a view showing the converter viewing from an arrow VIB in FIG. 6A.

An electric power converter according to a second embodiment is shown in FIGS. 44A to 6B. The resin member of the semiconductor module in the second embodiment includes a concavity. Further, the heat sink includes a convexity instead of the concavity, which corresponds to the concavity of the resin member. FIGS. 4A and 4B shows a cross sectional view of the electric power converter without a hatching.

In the second embodiment, the resin member 33 of the semiconductor module 3 has the concavity 332, which is concaved from the facing surface 331. In the present embodiment, as shown in FIGS. 5, 6A and 6B, the concavity 332 has a substantially straight line viewing in a direction perpendicular to the heat radiation surface 311.

Figure 5:
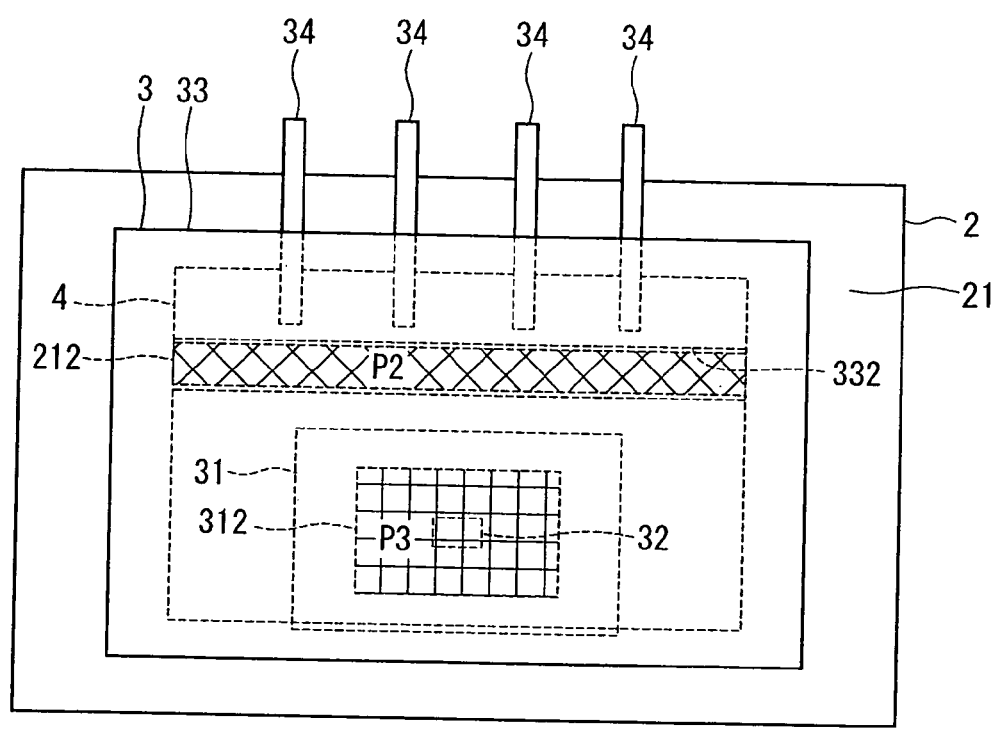
FIG. 5 is a view showing the converter viewing from an arrow V in FIG. 4A.

As shown in FIGS. 4B, 5 and 6A, the convexity 212 is formed at a position of the heat radiation surface 21 of the heat sink 2, the position corresponding to the concavity 332 of the resin member 33. The convexity 212 has a shape corresponding to the shape of the concavity 332 and protruding to the facing surface side. Specifically, the convexity 212 has a substantially straight line viewing in the direction perpendicular to the heat receiving surface 21.

The semiconductor module 3 is fixed to the heat sink 2 via a connecting member such as a screw (not shown) under a condition that the heat radiation member 4 is sandwiched between the semiconductor module 3 and the heat sink 2.

In the present embodiment, as shown in FIGS. 4A, 4B and 5, the heat radiation member 4 has a portion P2, which is sandwiched between the concavity 332 and the convexity 212. The portion P2 of the heat radiation member 4 corresponds to the concavity 332 of the resin member 33 and the convexity 212 of the heat sink 2, and is shown as a hatched region with a grid in FIG. 5. Thus, the heat radiation member 4 is deformed to be a shape corresponding to the shape of the convexity 212, as shown in FIG. 6A. Further, the heat radiation member 4 is tightly attached to the wall surface for providing the concavity 332 and the wall surface for providing the convexity 212.

In the present embodiment, as shown in FIGS. 4A, 4B and 5, the portion P3 of the heat radiation member 4 corresponding to the convexity 312 of the metal plate 31 is sandwiched between the heat receiving surface 21 of the heat sink 2 and the convexity 312. The portion P3 is shown as a hatched region with an orthogonal grid in FIG. 5.

Thus, in the present embodiment, a concavity 332 is formed on the facing surface 331 of the resin member 33 (or one of the heat receiving surface 21 of the heat sink 22 and the facing surface 331 of the resin member 33). The concavity 332 is concaved to a side opposite to the heat receiving surface 21 of the heat sink 2. A convexity 212 is disposed on the heat receiving surface 21 of the heat sink 2 (or the other one of the heat receiving surface 21 of the heat sink 22 and the facing surface 331 of the resin member 33) at a position corresponding to the concavity 332. The shape of the convexity 212 corresponds to the shape of the concavity 332, and the convexity 212 protrudes to the facing surface side. The portion P2 of the heat radiation member 4 corresponding to the concavity 332 and the convexity 212 is sandwiched between the concavity 332 and the convexity 212. The outer periphery portion of the portion P2 of the heat radiation member 4 is sandwiched between the inner wall of the concavity 332 perpendicular to the heat receiving surface 21 of the heat sink 2 and the outer wall of the convexity 212 perpendicular to the heat receiving surface 21 of the heat sink 2. Thus, even when the metal plate 31 expands and shrinks according to heat of the switching element 32, the displacement of the heat radiation member 4 in the planar direction caused by the ratcheting phenomenon is restricted. Accordingly, the heat radiation member 4 is restricted from protruding or being removed from an interface between the semiconductor module 3 and the heat sink 2.

Third Embodiment

Figure 7A:
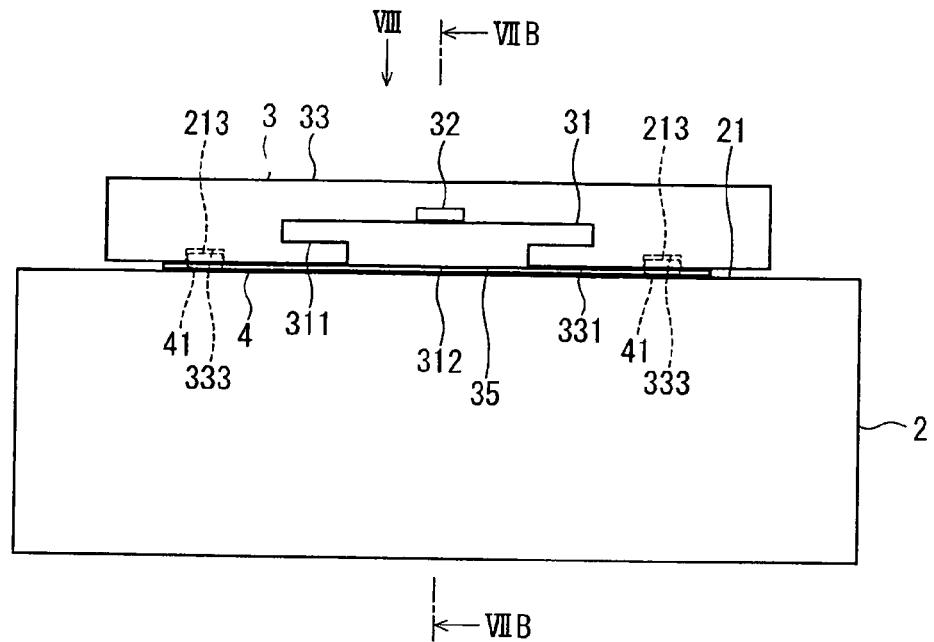
FIG. 7A is a cross sectional view showing an electric power converter taken along line VIIA-VIIA in FIG. 7B according to a third embodiment.
Figure 7B:
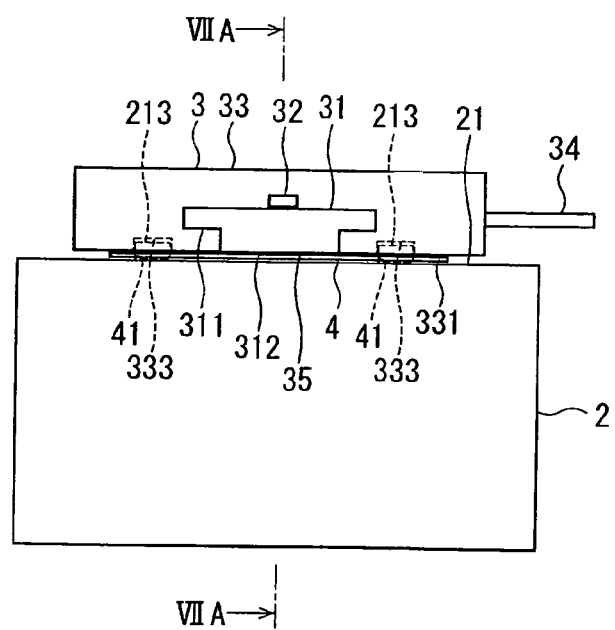
FIG. 7B is a cross sectional view showing the converter taken along line VIIB-VIIB in FIG. 7A.

An electric power converter according to a third embodiment is shown in FIGS. 7A to 9B. The number of the concavities of the resin member and the number of the convexities of the heat sink according to the third embodiment are different from the second embodiment. FIGS. 7A and 7B show a cross sectional view of the electric power converter without a hatching.

Figure 8:
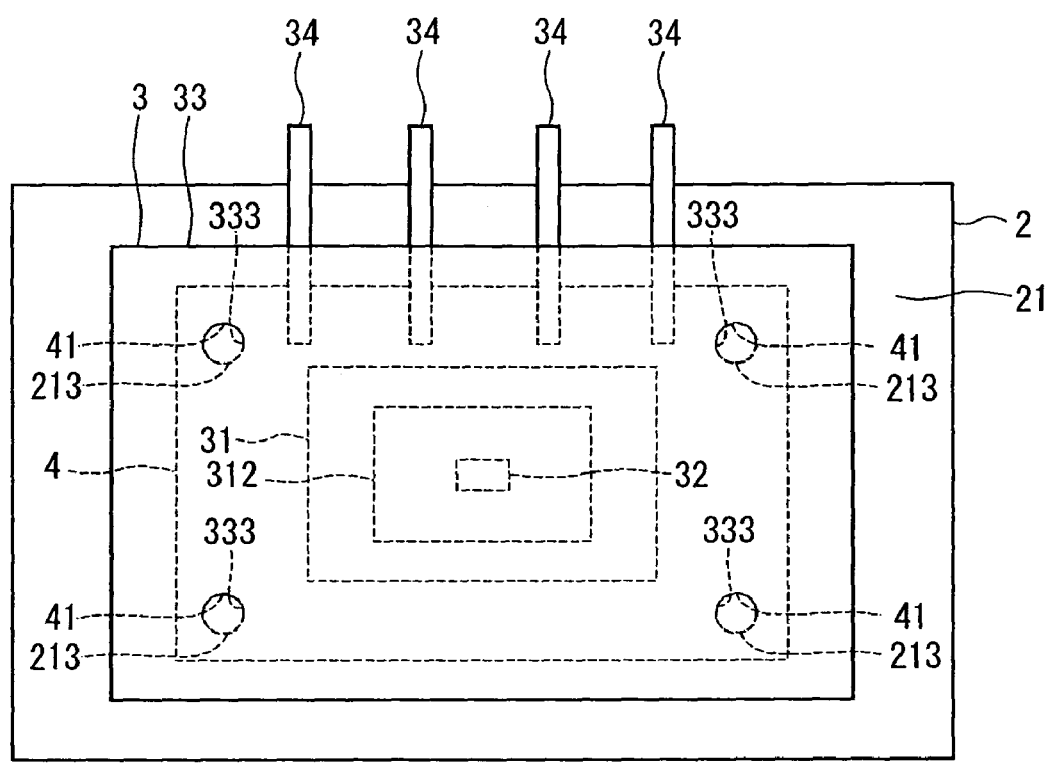
FIG. 8 is a view showing the converter viewing from an arrow VIII in FIG. 7A.
Figure 9A:
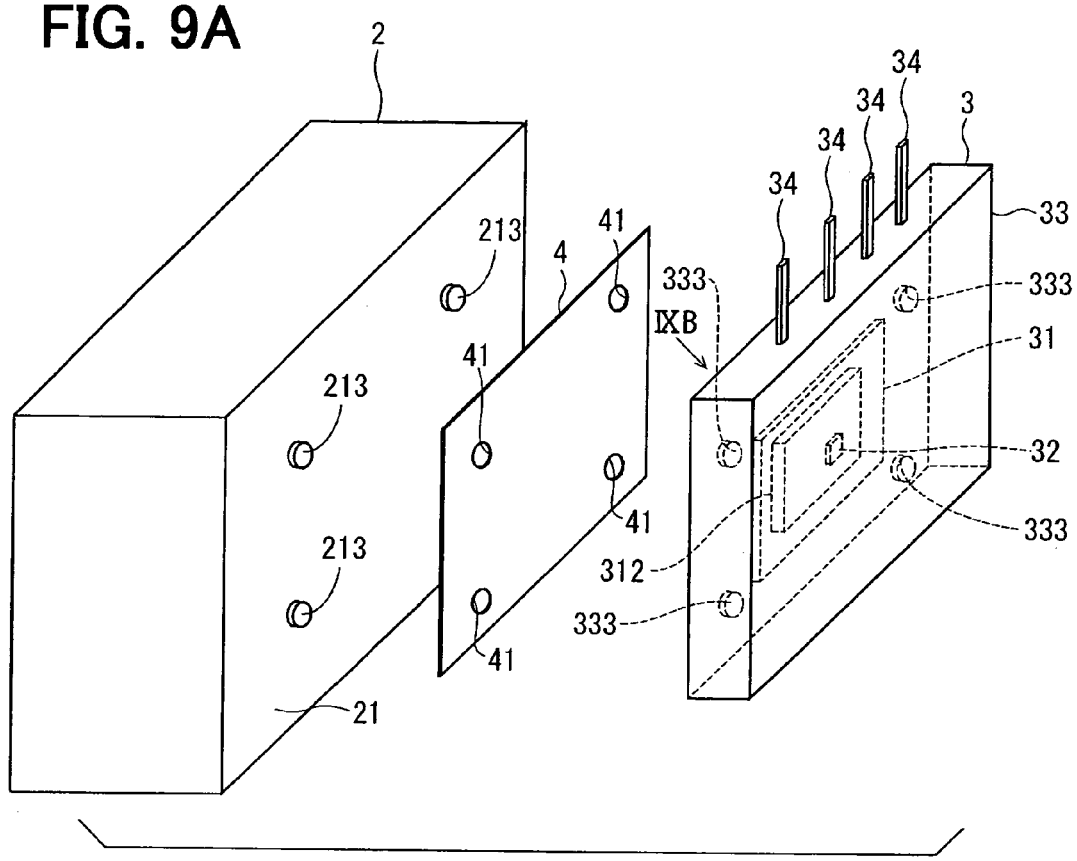
FIG. 9A is an exploded perspective view showing the electric power converter.
Figure 9B:
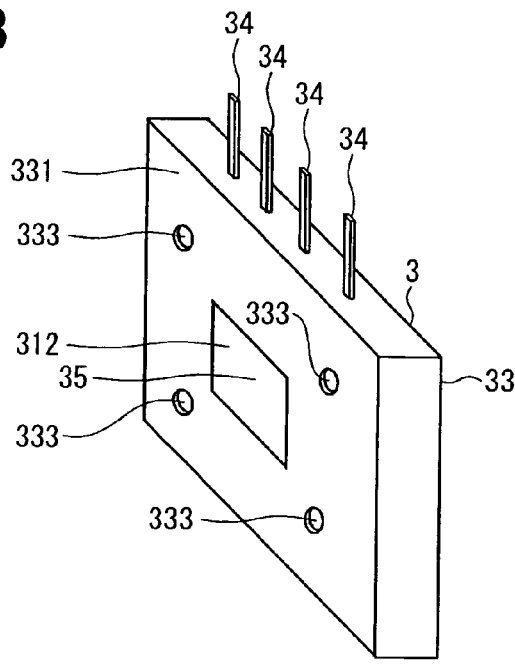
FIG. 9B is a view showing the converter viewing from an arrow IXB in FIG. 9A.

In the present embodiment, the resin member 33 of the semiconductor module 3 includes a concavity 333, which is concaved from the facing surface 331. As shown in FIGS. 8, 9A and 9B, four concavities 333 are formed on the facing surface 331. The shape of the inner wall for providing the concavity 333 is a substantially cylindrical shape.

As shown in FIGS. 7A to 9B, the heat receiving surface 21 of the heat sink 2 includes a convexity 213 at a position corresponding to the concavity 333 of the resin member 33. The convexity 213 has a shape corresponding to the shape of the concavity 333, and protrudes to the facing surface side. Specifically, four convexities 213 are formed on the heat receiving surface 21, and have a substantially columnar shape. In the present embodiment, the heat radiation member 4 has a hole 41 at a position corresponding to the convexity 213. Specifically, four holes 41 are formed on the heat radiation member 4.

In the present embodiment, the side 35 of the convexity 312 of the metal plate 31 opposite to the switching element 32 is disposed on the same plane as the facing surface 331 of the resin member 33. Specifically, only the side 35 of the metal plate 31 is exposed from the resin member 33.

Further, the semiconductor module 3 is fixed to the heat sink 2 with a connecting member such as a screw (not shown) under a condition that the heat radiation member 4 is sandwiched between the semiconductor module 3 and the heat sink 2.

As shown in FIGS. 7A to 8, the heat radiation member 4 is sandwiched between the heat receiving surface 21 of the heat sink 2 and the semiconductor module 3 under a condition that the convexity 213 penetrates the hole 41 and inserted into the concavity 333 of the resin member 33.

As described above, in the present embodiment, multiple concavities 333 are formed on the facing surface 331 of the resin member 33 (or one of the heat radiation surface 21 of the heat sink 2 and the facing surface 331 of the resin member 33), and each concavities 333 is concaved to a side opposite to the heat receiving surface 21 of the heat sink 2. Multiple convexities 213 are formed on the heat receiving surface 21 of the heat sink 2 (or the other one of the heat radiation surface 21 of the heat sink 2 and the facing surface 331 of the resin member 33) at a position corresponding to the concavity 333. Each convexity 213 has a shape corresponding to the shape of the concavity 333, and protrudes to the facing surface side. The heat radiation member 4 has a hole 41 at a position corresponding to the convexity 213. The heat radiation member 4 is sandwiched between the heat receiving surface 21 of the heat sink 2 and the semiconductor module 3 under a condition that the convexity 213 penetrates the hole 41, and is inserted into the concavity 333. In the present embodiment, the heat radiation member 4 is restricted from displacing in the planar direction by multiple convexities 213, which penetrates the hole 41 of the heat radiation member 4. Thus, even when the metal plate 31 expands and shrinks according to the heat of the switching element 32, the displacement of the heat radiation member 4 in the planar direction caused by the ratcheting phenomenon is restricted. Accordingly, the heat radiation member 4 is restricted from protruding or being removed from an interface between the semiconductor module 3 and the heat sink 2.

Fourth Embodiment

Figure 10A:
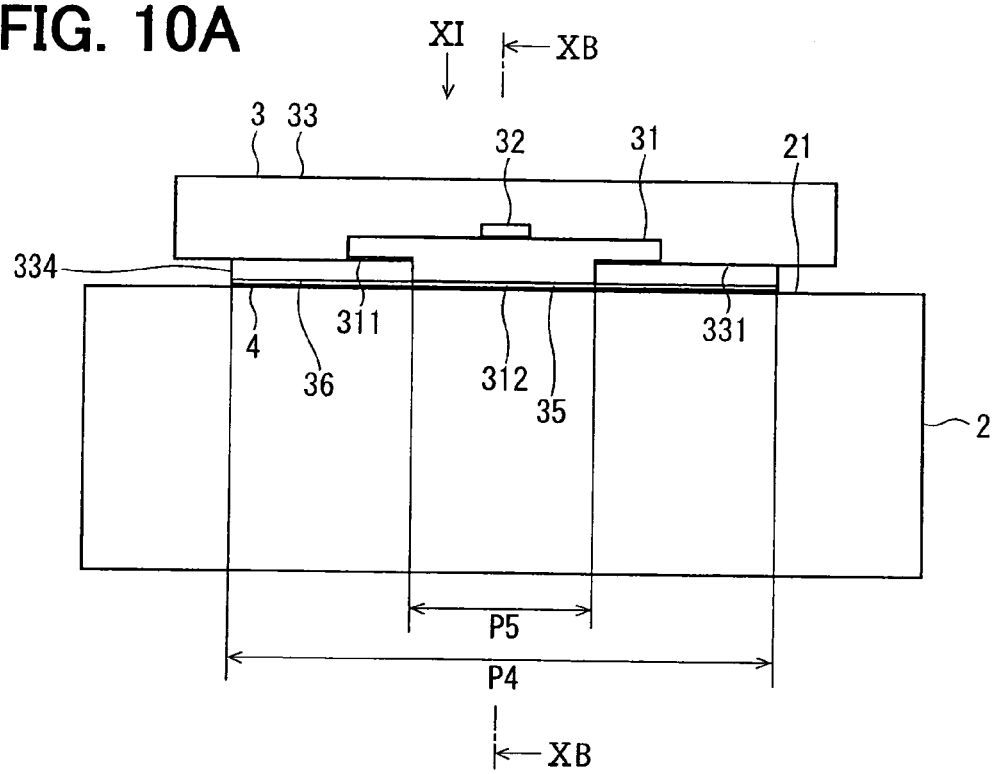
FIG. 10A is a cross sectional view showing an electric power converter taken along line XA-XA in FIG. 10B according to a fourth embodiment.
Figure 10B:
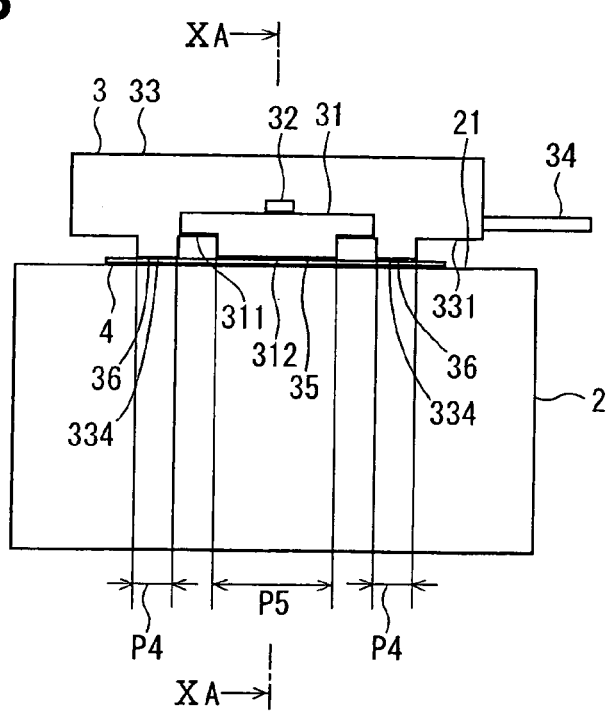
FIG. 10B is a cross sectional view showing the converter taken along line XB-XB in FIG. 10A.

An electric power converter according to a fourth embodiment is shown in FIGS. 10A to 12B. In the present embodiment, the heat sink does not include the concavity, and the resin member includes the convexity. Here, FIGS. 10A and 10B show a cross sectional view of the electric power converter without a hatching.

In the present embodiment, the heat sink 2 does not include the concavity 211 according to the first embodiment. Thus, the heat receiving surface 21 of the heat sink 2 is flat.

Further, in the present embodiment, the convexity 312 of the metal plate 31 corresponds to the metal protrusion. Specifically, the convexity 312 protrudes to the heat receiving surface side from the facing surface 331 of the resin member 33.

Figure 11:
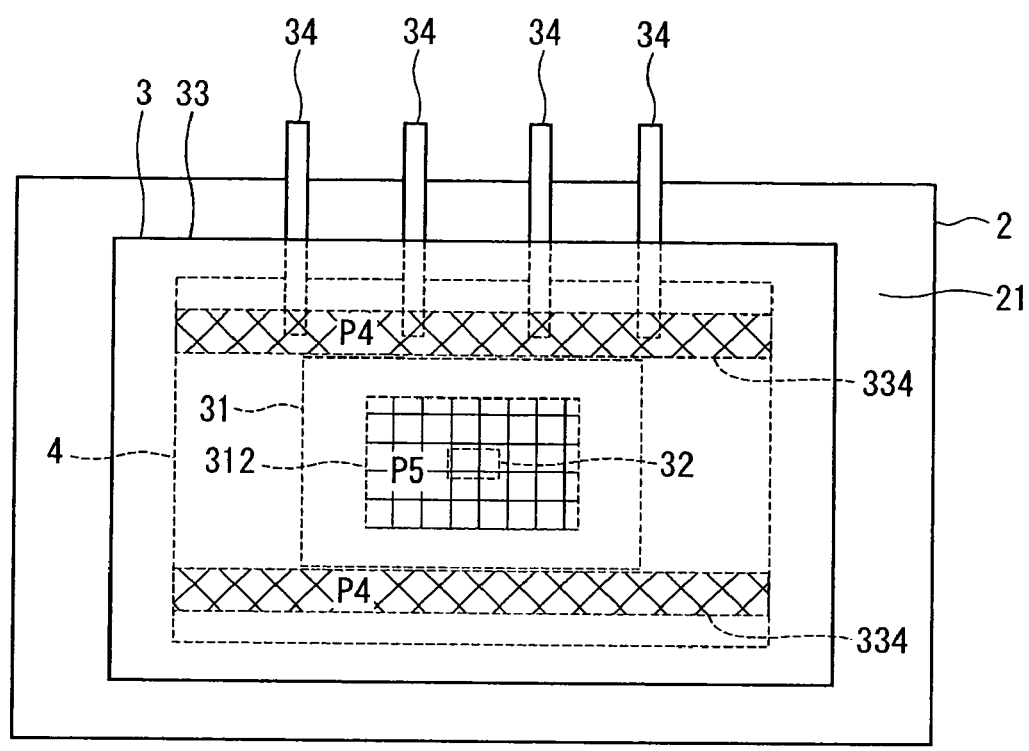
FIG. 11 is a view showing the converter viewing from an arrow XI in FIG. 10A.
Figure 12A:
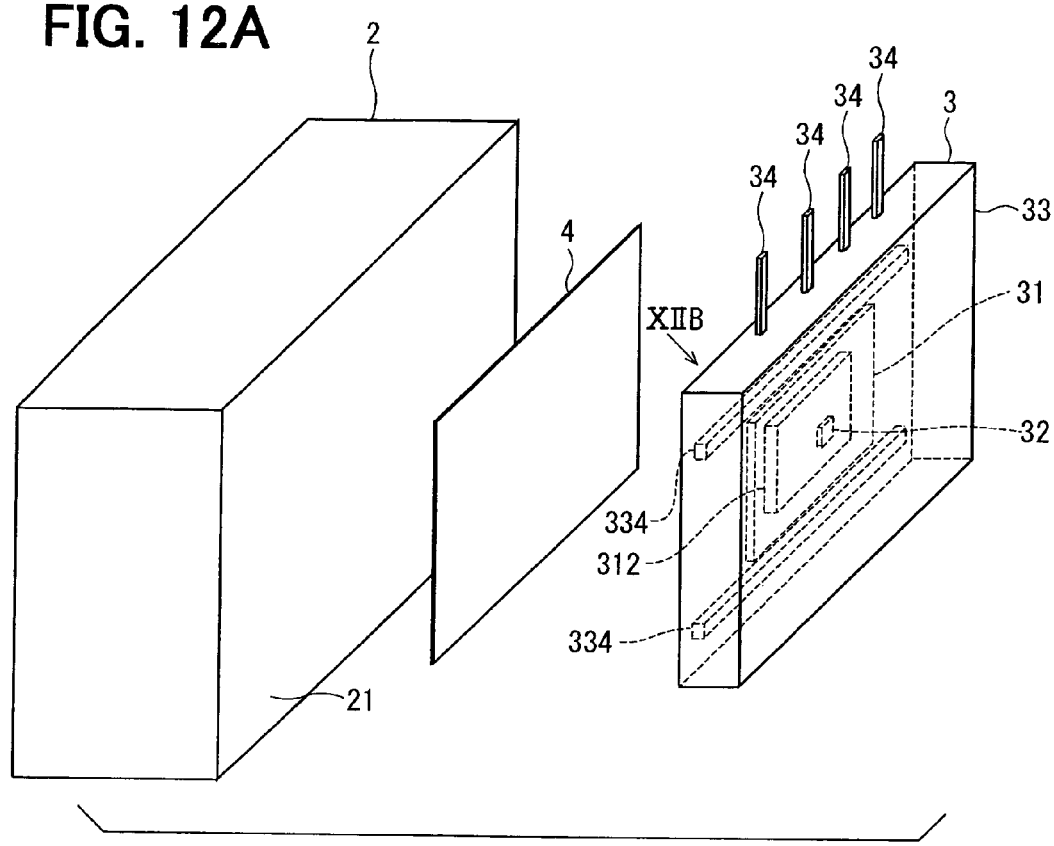
FIG. 12A is an exploded perspective view showing the electric power converter.
Figure 12B:
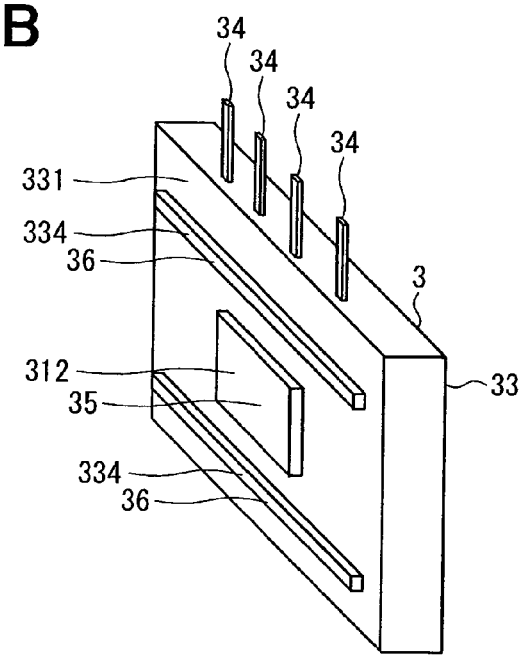
FIG. 12B is a view showing the converter viewing from an arrow XIIB in FIG. 12A.

A convexity 334 is formed on the facing surface 331 of the resin member 33. The convexity 334 protrudes to the heat receiving surface side, and has a height equal to the height of the convexity 312 protruding from the facing surface 331. In the present embodiment, as shown in FIGS. 11, 12A and 12B, two convexities 334 are formed, and have a linear shape. Further, two convexities 334 are in parallel to each other, and the convexity 312 of the metal plate 31 is disposed between the two convexities 334. Here, the convexity 334 of the resin member 33 corresponds to the resin protrusion.

Thus, the side 36 of the convexity 334 on the heat receiving surface side is disposed on the same plane as the side 35 of the convexity 312 of the metal plate 31.

The semiconductor module 3 is fixed to the heat sink 2 with a connecting member such as a screw (not shown) under a condition that the heat radiation member 4 is sandwiched between the semiconductor module 3 and the heat sink 2.

In the present embodiment, as shown in FIGS. 10A to 11, the portion P4 of the heat radiation member 4 corresponding to the convexity 334 of the resin member 33 is sandwiched between the convexity 334 and the heat receiving surface 21 of the heat sink 2. The portion P4 is shown as a hatched region with a grid in FIG. 11. The portion P5 of the heat radiation member corresponding to the convexity 312 of the metal plate 31 is sandwiched between the convexity 312 and the heat receiving surface 21 of the heat sink 2. The portion P5 is shown as a hatched region with an orthogonal grid in FIG. 11.

As described above, in the present embodiment, the heat radiation surface 311 of the metal plate 31 includes the convexity 312, which protrudes to the heat receiving surface side of the heat sink 2 from the facing surface 331 of the resin member 33. Multiple convexities 334 are formed on the facing surface 331 of the resin member 33. Each convexity 334 has the height equal to the height of the convexity 312 protruding from the facing surface 331, and protrudes to the heat receiving surface side of the heat sink 2. The convexity 312 is disposed between two adjacent convexities 334. The portions P4 and P5 of the heat radiation member 4 corresponding to the convexity 334 and the convexity 312, respectively, are sandwiched between the heat receiving surface 21 of the heat sink 2 and the convexity 3334 or the convexity 312. In general, the linear thermal expansion coefficient of resin is smaller than that of metal. In the present embodiment, since the heat radiation member 4 is sandwiched between multiple convexities 334 (of the resin member 33) and the heat receiving surface 21 of the heat sink 2, the heat radiation member 4 is stably pressed on the heat receiving surface side with multiple convexities 334. Thus, even when the metal plate 31 expands and shrinks repeatedly according to the heat of the switching element 32, the displacement of the heat radiation member 4 in the planar direction caused by the ratcheting phenomenon is restricted. Accordingly, the heat radiation member 4 is restricted from protruding or being removed from an interface between the semiconductor module 3 and the heat sink 2.

Other Embodiments

In the first embodiment, the heat sink 2 has the concavity 211, and the metal plate 31 has the convexity 312 corresponding to the concavity 211. Alternatively, the metal plate may have the concavity, and the heat sink may have the convexity corresponding to the concavity. Similarly, in the second third embodiments, the concavity of the resin member and the convexity of the heat sink may be replaced, so that the resin member has the convexity and the heat sink has the concavity.

Further, in the first embodiment, the concavity and the heat radiation member have the relationship of t1>t2. Alternatively, the concavity and the heat radiation member may not have the relationship of t1>t2.

Further, in the first embodiment, the concavity, the convexity and the heat radiation member have the relationship of: w1>w3; w2>w4; w1−w3<2×t2: and w2−w4<2×t2. Alternatively, the concavity, the convexity and the heat radiation member may not have the relationship of: w1−w3<2×t2: and w2−w4<2×t2.

In the first embodiment, the predetermined area S1 of the heat radiation member 4 has the portion P1, which is prepared by partitioning a part of the heat radiation member 4 with a virtual line L1. The virtual line L1 contacts the outer periphery portion of the switching element 32, and has a slanting angle of 45 degrees with respect to the thickness direction of the switching element 32. Alternatively, the portion of the heat radiation member corresponding to the concavity and the convexity may be prepared by partitioning a part of the heat radiation member with a virtual straight line contacting the outer periphery portion of the switching element and in parallel to the thickness direction of the switching element. In this case, the heat of the switching element can be transmitted to the heat sink via the heat radiation member stably and effectively.

In the above embodiments, a part of the convexity 312 of the metal plate 31 is exposed from the resin member 33. Alternatively, the convexity 312 of the metal plate 31 may not be exposed from the resin member 33, but is covered with the resin member 33. Further, when a part of the convexity 312 is exposed from the resin member 33, the convexity 312 of the metal plate 31 may be covered with a resin material film evaporated on the surface of the convexity 312.

The heat radiation member may be made of any material as long as the heat radiation member has insulation property and heat conductivity. Alternatively, the heat radiation member may be in a liquid phase before the heat radiation member is assembled in the converter, and the heat radiation member may be solidified after the heat radiation member is assembled in the converter.

The present invention may be applied to other equipment driven by the alternating electric power in addition to the alternating electric motor.

The above disclosure has the following aspects.

According to a first aspect of the present disclosure, an electric power converter includes: a heat sink having a heat receiving surface; a semiconductor module including a metal plate, a switching element and a resin member, wherein the metal plate has a heat radiation surface facing the heat receiving surface, the switching element is disposed on a surface of the metal plate opposite to the heat radiation surface and generates heat when the switching element functions, and the resin member covers at least a part of the switching element and a part of the metal plate; and a heat radiation member having a sheet shape and disposed between the heat receiving surface of the heat sink and the semiconductor module for transmitting the heat of the switching element to the heat receiving surface via the metal plate. One of the heat receiving surface and the heat radiation surface includes a concavity, which is concaved to a side opposite to the other one of the heat receiving surface and the heat radiation surface. The other one of the heat receiving surface and the heat radiation surface includes a convexity at a position corresponding to the concavity. The convexity has a shape corresponding to the concavity, and protrudes to the side opposite to the other one of the heat receiving surface and the heat radiation surface. The heat radiation member has a predetermined area corresponding to the concavity and the convexity. The predetermined area of the heat radiation member is sandwiched between the concavity and the convexity.

In the above converter, an outer periphery portion of the predetermined area of the heat radiation member is sandwiched between an inner wall of the concavity perpendicular to the heat receiving surface of the heat sink and an outer wall of the convexity perpendicular to the heat receiving surface. Thus, even when the metal plate expands and shrinks according to the heat in the switching element, the displacement of the heat radiation member in a planar direction caused by a ratcheting phenomenon is restricted. Accordingly, the heat radiation member is restricted from protruding and being removed from a space between the heat sink and the semiconductor module.

Alternatively, the concavity may have a depth of a concaved portion, and the depth of the concavity is defined by t1. The heat radiation member has a thickness, which is defined by t2. The thickness of the heat radiation member and the depth of the concavity has a relationship of: t1>t2. In this case, the outer periphery portion of the predetermined area of the heat radiation member is sandwiched between the inner wall of the concavity perpendicular to the heat receiving surface of the heat sink and the outer wall of the convexity perpendicular to the heat receiving surface. The depth of the concavity is larger than the thickness of the heat radiation member. Thus, the displacement of the heat radiation member in the planar direction caused by the ratcheting phenomenon is restricted much effectively.

Alternatively, each of the concavity and the convexity may have an outline of a rectangular shape viewing in a direction perpendicular to the heat receiving surface. The concavity has a width in a longitudinal direction defined by w1 and a width in a lateral direction defined by w2. The convexity has a width in a longitudinal direction defined by w3 and a width in a lateral direction defined by w4. W1 to w4 and t1 to t2 have a relationship of: 0<w1−w3<=2×t2; and 0<w2−w4<=2×t2. In this case, the outer periphery portion of the predetermined area of the heat radiation member is sandwiched between the inner wall of the concavity perpendicular to the heat receiving surface of the heat sink and the outer wall of the convexity perpendicular to the heat receiving surface, or the heat radiation member is pressed and shrinks (i.e., elastically deformed). Thus, the displacement of the heat radiation member in the planar direction caused by the ratcheting phenomenon is restricted much effectively.

Alternatively, the predetermined area of the heat radiation member may include at least a part of the heat radiation member, which is defined by partitioning the part with a virtual straight line contacting an outer periphery of the switching element and in parallel to a thickness direction of the switching element. In this case, since the heat radiation member is sandwiched between the concavity and the convexity, at least the predetermined area is restricted from moving in the planar direction caused by the ratcheting phenomenon. Accordingly, heat generated by the switching element is stably and effectively transmitted to the heat sink via the heat radiation member.

Alternatively, the predetermined area of the heat radiation member may include at least a part of the heat radiation member, which is defined by partitioning the part with a virtual straight line contacting an outer periphery of the switching element and having a slanting angle of 45 degrees with respect to a thickness direction of the switching element. In this case, since the heat radiation member is sandwiched between the concavity and the convexity, at least the predetermined area is restricted from moving in the planar direction caused by the ratcheting phenomenon. Accordingly, heat generated by the switching element is stably and effectively transmitted to the heat sink via the heat radiation member.

Alternatively, the heat radiation member may be made of a glass fiber cloth with silicone rubber including a filler. The heat radiation member has an electric insulation property and heat conductivity. The heat radiation member is elastically deformable.

Alternatively, t2 is larger than zero, and smaller than 0.5 millimeters.

According to a second aspect of the present disclosure, an electric power converter includes: a heat sink having a heat receiving surface; a semiconductor module including a metal plate, a switching element and a resin member, wherein the metal plate has a heat radiation surface facing the heat receiving surface, the switching element is disposed on a surface of the metal plate opposite to the heat radiation surface and generates heat when the switching element functions, and the resin member covers at least a part of the switching element and a part of the metal plate and includes a facing surface facing the heat receiving surface; and a heat radiation member having a sheet shape and disposed between the heat receiving surface of the heat sink and the semiconductor module for transmitting the heat of the switching element to the heat receiving surface via the metal plate. One of the heat receiving surface and the facing surface includes a concavity, which is concaved to a side opposite to the other one of the heat receiving surface and the facing surface. The other one of the heat receiving surface and the facing surface includes a convexity at a position corresponding to the concavity. The convexity has a shape corresponding to the concavity, and protrudes to the side opposite to the other one of the heat receiving surface and the facing surface. The heat radiation member has a part corresponding to the concavity and the convexity. The part of the heat radiation member is sandwiched between the concavity and the convexity.

In the above converter, an outer periphery portion of the part of the heat radiation member is sandwiched between an inner wall of the concavity perpendicular to the heat receiving surface of the heat sink and an outer wall of the convexity perpendicular to the heat receiving surface. Thus, even when the metal plate expands and shrinks according to the heat in the switching element, the displacement of the heat radiation member in a planar direction caused by a ratcheting phenomenon is restricted. Accordingly, the heat radiation member is restricted from protruding and being removed from a space between the heat sink and the semiconductor module.

According to a third aspect of the present disclosure, an electric power converter includes: a heat sink having a heat receiving surface; a semiconductor module including a metal plate, a switching element and a resin member, wherein the metal plate has a heat radiation surface facing the heat receiving surface, the switching element is disposed on a surface of the metal plate opposite to the heat radiation surface and generates heat when the switching element functions, and the resin member covers at least a part of the switching element and a part of the metal plate and includes a facing surface facing the heat receiving surface; and a heat radiation member having a sheet shape and disposed between the heat receiving surface of the heat sink and the semiconductor module for transmitting the heat of the switching element to the heat receiving surface via the metal plate. One of the heat receiving surface and the facing surface includes a plurality of concavities, which are concaved to a side opposite to the other one of the heat receiving surface and the facing surface. The other one of the heat receiving surface and the facing surface includes a plurality of convexities at positions corresponding to the concavities. Each convexity has a shape corresponding to the concavity, and protrudes to the side opposite to the other one of the heat receiving surface and the facing surface. The heat radiation member has a plurality of holes at positions corresponding to the convexities. The heat radiation member is sandwiched between the concavity and the convexity in such a manner that each convexity penetrates a corresponding hole, and is inserted into a corresponding concavity.

In the above converter, the heat radiation member is restricted from moving in the planar direction since multiple convexities are inserted through the holes of the heat radiation member. Thus, even when the metal plate expands and shrinks according to the heat in the switching element, the displacement of the heat radiation member in a planar direction caused by the ratcheting phenomenon is restricted. Accordingly, the heat radiation member is restricted from protruding and being removed from a space between the heat sink and the semiconductor module.

According to a fourth aspect of the present disclosure, an electric power converter includes: a heat sink having a heat receiving surface; a semiconductor module including a metal plate, a switching element and a resin member, wherein the metal plate has a heat radiation surface facing the heat receiving surface, the switching element is disposed on a surface of the metal plate opposite to the heat radiation surface and generates heat when the switching element functions, and the resin member covers at least a part of the switching element and a part of the metal plate and includes a facing surface facing the heat receiving surface; and a heat radiation member having a sheet shape and disposed between the heat receiving surface of the heat sink and the semiconductor module for transmitting the heat of the switching element to the heat receiving surface via the metal plate. The heat radiation surface includes a metal convexity, which protrudes to a heat receiving surface side from the facing surface. The facing surface includes a plurality of resin convexities, which protrude to the heat receiving surface side. Each resin convexity has a protrusion height from the facing surface, and the protrusion height of the resin convexity is substantially equal to a protrusion height of the metal convexity from the facing surface. The metal convexity is disposed between adjacent resin convexities. The heat radiation member has a part corresponding to the resin convexity and the metal convexity. The part of the heat radiation member is sandwiched between the metal convexity and the heat receiving surface.

In the above converter, the part of the heat radiation member is sandwiched between the metal convexity or the resin convexity and the heat receiving surface of the heat sink. In general, the linear thermal expansion coefficient of resin is smaller than that of metal. Since the heat radiation member is sandwiched between multiple resin convexities and the heat receiving surface of the heat sink, the heat radiation member is stably pressed on the heat receiving surface side with multiple resin convexities. Thus, even when the metal plate expands and shrinks repeatedly according to the heat of the switching element, the displacement of the heat radiation member in the planar direction caused by the ratcheting phenomenon is restricted. Accordingly, the heat radiation member is restricted from protruding or being removed from an interface between the semiconductor module and the heat sink.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. An electric power converter comprising:
a heat sink having a heat receiving surface;
a semiconductor module including a metal plate, a switching element and a resin member, wherein the metal plate has a heat radiation surface facing the heat receiving surface, the switching element is disposed on a surface of the metal plate opposite to the heat radiation surface and generates heat when the switching element functions, and the resin member covers at least a part of the switching element and a part of the metal plate; and
a heat radiation member having a sheet shape and disposed between the heat receiving surface of the heat sink and the semiconductor module for transmitting the heat of the switching element to the heat receiving surface via the metal plate,
wherein one of the heat receiving surface and the heat radiation surface includes a concavity, which is concaved to a side opposite to the other one of the heat receiving surface and the heat radiation surface,
wherein the other one of the heat receiving surface and the heat radiation surface includes a convexity at a position corresponding to the concavity,
wherein the convexity has a shape corresponding to the concavity, and protrudes to the side opposite to the other one of the heat receiving surface and the heat radiation surface,
wherein the heat radiation member has a predetermined area corresponding to the concavity and the convexity, and
wherein the predetermined area of the heat radiation member is sandwiched between the concavity and the convexity.

2. The electric power converter according to claim 1,
wherein the concavity has a depth of a concaved portion, and the depth of the concavity is defined by $t1$,
wherein the heat radiation member has a thickness, which is defined by $t2$, and
wherein the thickness of the heat radiation member and the depth of the concavity has a relationship of: $t1 > t2$.

3. The electric power converter according to claim 2,
wherein each of the concavity and the convexity has an outline of a rectangular shape viewing in a direction perpendicular to the heat receiving surface,
wherein the concavity has a width in a longitudinal direction defined by $w1$ and a width in a lateral direction defined by $w2$,
wherein the convexity has a width in a longitudinal direction defined by $w3$ and a width in a lateral direction defined by $w4$, and
wherein $w1$ to $w4$ and $t1$ to $t2$ have a relationship of:

$0 < w1 - w3 <= 2 \times t2$; and $0 < w2 - w4 <= 2 \times t2$.

4. The electric power converter according to claim 1,
wherein the predetermined area of the heat radiation member includes at least a part of the heat radiation member, which is defined by partitioning the part with a virtual straight line contacting an outer periphery of the switching element and in parallel to a thickness direction of the switching element.

5. The electric power converter according to claim 1,
wherein the predetermined area of the heat radiation member includes at least a part of the heat radiation member, which is defined by partitioning the part with a virtual straight line contacting an outer periphery of the switching element and having a slanting angle of 45 degrees with respect to a thickness direction of the switching element.

6. The electric power converter according to claim 3,
wherein the heat radiation member is made of a glass fiber cloth with silicone rubber including a filler,
wherein the heat radiation member has an electric insulation property and heat conductivity, and
wherein the heat radiation member is elastically deformable.

7. The electric power converter according to claim 6,
wherein $t2$ is larger than zero, and smaller than 0.5 millimeters.

8. An electric power converter comprising:
a heat sink having a heat receiving surface;
a semiconductor module including a metal plate, a switching element and a resin member, wherein the metal plate has a heat radiation surface facing the heat receiving surface, the switching element is disposed on a surface of the metal plate opposite to the heat radiation surface and generates heat when the switching element functions, and the resin member covers at least a part of the switching element and a part of the metal plate and includes a facing surface facing the heat receiving surface; and
a heat radiation member having a sheet shape and disposed between the heat receiving surface of the heat sink and the semiconductor module for transmitting the heat of the switching element to the heat receiving surface via the metal plate,
wherein one of the heat receiving surface and the facing surface includes a concavity, which is concaved to a side opposite to the other one of the heat receiving surface and the facing surface,
wherein the other one of the heat receiving surface and the facing surface includes a convexity at a position corresponding to the concavity,
wherein the convexity has a shape corresponding to the concavity, and protrudes to the side opposite to the other one of the heat receiving surface and the facing surface,
wherein the heat radiation member has a part corresponding to the concavity and the convexity, and
wherein the part of the heat radiation member is sandwiched between the concavity and the convexity.

9. An electric power converter comprising:
a heat sink having a heat receiving surface;
a semiconductor module including a metal plate, a switching element and a resin member, wherein the metal plate has a heat radiation surface facing the heat receiving surface, the switching element is disposed on a surface of the metal plate opposite to the heat radiation surface and generates heat when the switching element functions, and the resin member covers at least a part of the switching element and a part of the metal plate and includes a facing surface facing the heat receiving surface; and
a heat radiation member having a sheet shape and disposed between the heat receiving surface of the heat sink and the semiconductor module for transmitting the heat of the switching element to the heat receiving surface via the metal plate,
wherein one of the heat receiving surface and the facing surface includes a plurality of concavities, which are concaved to a side opposite to the other one of the heat receiving surface and the facing surface,
wherein the other one of the heat receiving surface and the facing surface includes a plurality of convexities at positions corresponding to the concavities,
wherein each convexity has a shape corresponding to the concavity, and protrudes to the side opposite to the other one of the heat receiving surface and the facing surface,
wherein the heat radiation member has a plurality of holes at positions corresponding to the convexities, and
wherein the heat radiation member is sandwiched between the concavity and the convexity in such a manner that each convexity penetrates a corresponding hole, and is inserted into a corresponding concavity.

10. An electric power converter comprising:
a heat sink having a heat receiving surface;
a semiconductor module including a metal plate, a switching element and a resin member, wherein the metal plate has a heat radiation surface facing the heat receiving surface, the switching element is disposed on a surface of the metal plate opposite to the heat radiation surface and generates heat when the switching element functions, and the resin member covers at least a part of the switching element and a part of the metal plate and includes a facing surface facing the heat receiving surface; and
a heat radiation member having a sheet shape and disposed between the heat receiving surface of the heat sink and the semiconductor module for transmitting the heat of the switching element to the heat receiving surface via the metal plate,
wherein the heat radiation surface includes a metal convexity, which protrudes to a heat receiving surface side from the facing surface,
wherein the facing surface includes a plurality of resin convexities, which protrude to the heat receiving surface side,
wherein each resin convexity has a protrusion height from the facing surface, and the protrusion height of the resin convexity is substantially equal to a protrusion height of the metal convexity from the facing surface,
wherein the metal convexity is disposed between adjacent resin convexities,
wherein the heat radiation member has a part corresponding to the resin convexity and the metal convexity, and
wherein the part of the heat radiation member is sandwiched between the metal convexity and the heat receiving surface.

* * * * *